June 21, 1966 R. E. ANDERSON 3,257,247
METHOD OF FORMING A P-N JUNCTION
Filed Oct. 17, 1962
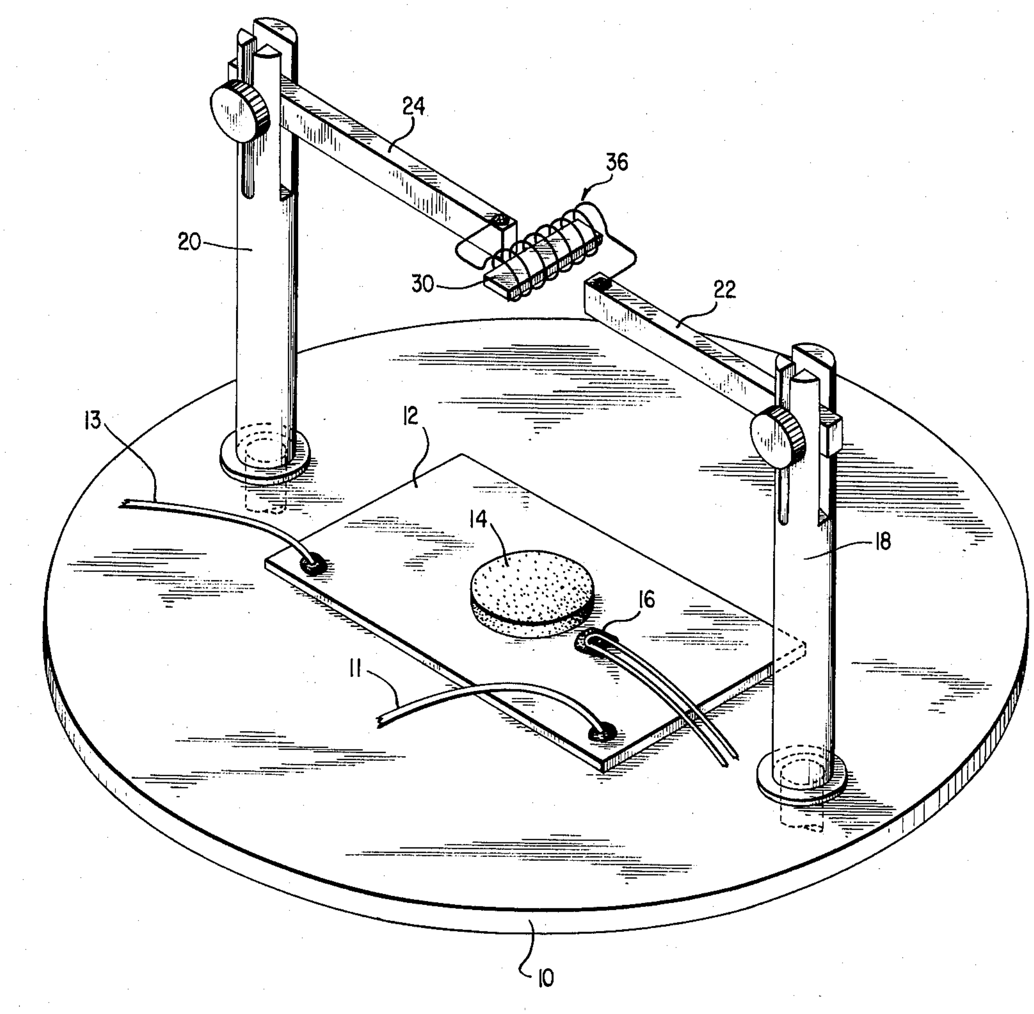
INVENTOR.
ROBERT E. ANDERSON
BY
Stevens, Davis, Miller & Mosher
ATTORNEYS.

3,257,247

METHOD OF FORMING A P-N JUNCTION

Robert E. Anderson, Kingsville, Tex., assignor to Texas Instruments Incorporated, Dallas, Tex., a corporation of Delaware Filed Oct. 17, 1962, Ser. No. 231,147
5 Claims. (Cl. 148—179)

This invention relates to an improved method of making semiconductor devices and, more particularly, to a method of forming P-N junctions in semiconductor devices.

Prior methods of making junctions in which a homogeneous wafer of semiconductor material is treated to form the junction have been variously labeled as alloying and diffusion techniques. In the former method, the junction is made by heating a wafer of semiconductor in contact with an impurity element which becomes liquid at the temperature used. This method is often referred to as the alloying technique.

In the diffusion technique, the P-N junction is formed by diffusing impurity atoms of an opposite type conductivity into one or more surfaces of a single crystal semiconductor wafer. The distinguishing feature is that in this method the portion of the semiconductor taking part in the diffusion process remains in the solid state and does not form a liquid alloy or eutectic with the impurity material.

Although impurity diffusion techniques have been successful in producing excellent quality P-N junctions and in obtaining good control of the depth of penetration and impurity concentration at the junction, these techniques require several sequentially performed operations, such as, etching, masking, etc., to achieve a final product, and consequently the overall processing is somewhat complex. Difficulty has also been experienced with alloying techniques in that control of the depth of penetration of the impurities and desirable impurity concentrations at the junction region are not easily obtainable.

In the evaporation alloying method, as presently practiced, the material with which the evaporated particles are to be alloyed may be heated to a suitable temperature whereby alloying may take place during the vaporization cycle. Alternatively, the vaporized particles may be deposited on a cold substrate and the alloying effected later as a separate step in the process. By regulating of the temperature and charge, a good degree of depth control may be obtained; however, after the liquid has reached its farthest penetration, solid diffusion takes place with a resultant P-N junction forming inside the undisturbed crystal, the penetrability of the diffused atoms reaching a depth dependent upon the time and temperature under which the process is carried out. This diffusion frequently causes undesirably thick junction regions. It is to overcome this specific problem that the present invention was conceived.

It has been discovered that if a semiconductor material (single crystal) of a particular conductivity is heated to almost its melting temperature, and if a semiconductor material of opposite conductivity is vapor deposited thereon by raising its temperature to its threshold of vaporization, the individual vapor particles will contain sufficient energy to momentarily raise the points of impact on the semiconductor material of the particular conductivity above their melting temperature. Since the bulk of semiconductor material is below its melting temperature, these impact points grow back in a fashion following the original crystalline structure. Thus, there is produced an extremely sharp P-N junction having a monocrystalline structure. Since the penetration of the evaporated particles within the crystal is exceedingly small, the boundary of the P-N junction coincides very closely with the original surface.

The above is accomplished in the present invention through the practice of a highly unique and novel method for alloying a semiconductor material of a P-type to a single crystal body of semiconductor material of N-type. In this respect, a body of N-type semiconductor material and a P-type semiconductor material are placed together in a vacuum chamber. The P-type material is placed in a heater such as is normally used for evaporating purposes. The N-type body of semiconductor material is positioned on a heater strip which is located closely adjacent to the P-type material so as to receive the semiconductor particles as they issue forth from the evaporator.

The heater strip is used to elevate the semiconductor body of N-type material to a temperature below its melting point. It is most important that the temperature of this semiconductor body be held from about 35° C. to about 60° C. below its melting temperature. Upon the application of an electric current to the evaporator coil, the P-type semiconductor material will commence evaporating and particles thereof will be deposited upon the surface of the N-type semiconductor body. The particles being deposited carry with them sufficient heat to raise the temperature at the point of impact to a value above the melting point of the N-type semiconductor material thereby allowing the deposited particles to alloy with the surface of the semiconductor member.

In addition to the heat carried by the evaporated particle, the kinetic energy of the particle and the radiant energy emanating from the evaporator coil are effective in the formation of the junction. It should be stressed here that the formation is actually carried out by an alloying process; however, the characteristic melting is localized to the immediate area of impact since the bulk of the N-type semiconductor member is below the melting point and therefore acts to absorb any excess thermal energy.

The minute portion of the N-type semiconductor member which is melted recrystallizes with the characteristics of the P-type semiconductor material. In this manner, a very thin monocrystalline junction of semiconductor material having P-type characteristics can be readily produced. Also of particular significance is the fact that this process lends itself to mass production techniques wherein a closely controlled product is desired. Thus, a graded junction will result having a thickness on the order of a fraction of a mil. Samples of either conductivity may be alternately energized to produce any number of junctions in series. In addition, utilization of this method allows mesas to be grown directly on the sample of semiconductor material.

Accordingly, it is the general object of this invention to provide an improved method of producing a P-N junction in a semiconductor member.

It is another object of this invention to provide a method of controlling the depth of penetration of semiconductor particles of one conductivity being alloyed to a semiconductor member of opposite conductivity.

It is also an object of the invention to provide a method of forming a continuous monocrystalline P-N junction in a semiconductor member.

A further object of this invention is to provide a method for producing in a semiconductor a plurality of independent or serially connected P-N junctions.

Still a further object of this invention is to provide a method for producing a P-N junction in a semiconductor having a closely controlled impurity concentration which is capable of being mass produced.

Still another object of this invention is to provide an easy and efficient way of growing mesa junctions in a semiconductor member.

These and other objects of this invention will be appreciated more fully from the following detailed specification when taken in conjunction with the appended claims and attached drawing which shows the apparatus required to carry out the method of the invention.

Referring now to the drawing, it will be noted that an electrically insulated table 10 is portrayed upon which is located a molybdenum heating plate 12; a thermocouple 16 is provided to insure that the temperature of the single crystal semiconductor wafer 14 is maintained at a predetermined value. Leads 11 and 13 are connected to plate 12 which, in turn, are connected to a suitable power supply (not shown) for the purpose of maintaining the semiconductor wafer at a predetermined temperature.

It is to be understood that the thermocouple 16 can be connected to control the power supply, whereby the temperature of the semiconductor wafer 14 can be automatically governed. Two posts 18 and 20 are fitted through the table 10 and serve to hold electrode arms 22 and 24. A tungsten coil 36 is held between the ends of the two arms 22 and 24. As shown in the drawing, the ends of the coil 36 are attached to the ends of the two arms.

The entire assembly, as illustrated in the drawing, is housed within a suitable vacuum evaporation chamber (not shown) such as a bell chamber or the like, as is well known in the art. Upon the application of an electric current through the arms 22 and 24 and the coil 36, the temperature of the tungsten coil is raised to a temperature sufficient to cause particles of the semiconductor 30 to be vaporized. A portion of these particles is deposited on the semiconductor wafer 14. It is desirable that the semiconductor wafer 14 be positioned in close proximity to the evaporation unit, and in actual practice, the separation distance is about 4 inches.

In the practice of the invention, particles of the P-type semiconductor material evaporate from the source 30 due to the application of electric current through the tungsten coil 36 from a power supply not shown. These particles are deposited on the exposed surface of the semiconductor wafer 14. If the wafer 14 is maintained at a temperature of from 35° C. to 60° C. below its melting point, the particles of opposite conductivity, in striking the exposed surface of the semiconductor wafer 14, transfer their heat to the point of contact whereby the temperature at the impact points is raised above the melting point. Because the bulk of the semiconductor wafer 14 is below the melting point, the impact points grow back in a fashion following the crystal structure of the N-type wafer 14; however, the concentrations at this point are of the P-type semiconductor material.

A typical P-N junction is made in accord with the above-described technique as follows. A monocrystalline N-type germanium wafer is first cleaned by a standard method such as rinsing in a bath of HF to remove any oxide and then placed on the molybdenum plate 12. A sample of P-type germanium weighing approximately 100 mg. is placed inside of the tungsten coil. After establishing a vacuum of approximately $10^{-5}$ mm. of Hg or less, an electric current is caused to pass through the molybdenum plate 12 for the purpose of heating the N-type germanium wafer to a temperature between 900° C. and 925° C. The thermocouple 16 is used to insure that this temperature is maintained. The wafer is positioned approximately four inches away from the tungsten filament 36. A metal shield (not shown) is initially interposed between the charge source 30 and the N-type germanium wafer 14 so as to intercept any contaminates on the surface of the P-type source 30 since the contaminates evaporate before the P-type material. When the surface contaminates have been removed and the P-type source is evaporating at a slow rate, the shield is moved out of position and the evaporation is allowed to proceed. In this manner, a very thin P-N junction of desired concentration is formed.

Although germanium is specified in the above example, the process works equally well for making junctions, or series of junctions, for most semiconductors and samples of semiconductor material of either type conductivity (silicon, gallium arsenide, etc.) may be used as the evaporant 30 or wafer 14. The main advantages of this process is that it lends itself to mass production techniques with a high degree of control of concentration and allows mesa junctions to be grown directly on the sample.

Although the present invention has been shown and described with reference to a single preferred embodiment, and specific examples have been given showing how the method of the invention is carried out, nevertheless, changes and modifications will occur to those skilled in the art which, in fact, do not depart from the teaching of the present invention. Such changes and modifications are deemed to be within the scope and spirit of the invention as defined in the appended claims.

What is claimed is:

1. A method of forming a semiconductor device having a P-N junction therein, comprising the steps of heating a wafer of monocrystalline semiconductor material of one conductivity-type in an evacuated chamber to a temperature slightly below the melting point of said wafer, evaporating a body of semiconductor material of opposite conductivity-type in said evacuated chamber in spaced relation with said wafer, and melting the portions of the wafer contacted by the heat-laden evaporated particles from said body, whereby regrowth of the melted portions of the wafer and the evaporated particles is effected.

2. A method of forming a P-N junction, comprising the steps of heating a wafer of semiconductor material of one conductivity-type to a temperature of from 35° C. to 60° C. below its melting point, evaporating thereon heat-laden particles of a semiconductor material of opposite conductivity-type, and melting the portions of said wafer contacted by said evaporated particles, whereby regrowth of the crystalline structure of the wafer is effected following the lattice symmetry of said wafer of semiconductor material but being of the opposite conductivity-type.

3. A method of forming a P-N junction, comprising the steps of heating a first substantially germanium body of one conductivity type to a temperature of approximately 900° C., evaporating thereon heat-laden particles of a second substantially germanium containing body of an opposite conductivity type, and melting the portions of said first germanium containing body contacted by the evaporated particles from said second germanium containing body, whereby regrowth of said melted portions is effected to form an alloy type P-N junction.

4. A method of forming a P-N junction, comprising the steps of positioning a semiconductor body of one conductivity type in spaced relation to a source of semiconductor material of opposite conductivity-type, heating said semiconductor body to a temperature slightly below the melting point thereof, evaporating heat-laden particles from said source whereby said particles deposit onto said semiconductor body, and melting the portions of said semiconductor body contacted by the evaporated particles, whereby recrystallization is effected with the crystalline symmetry of said semiconductor body and with the conductivity-type of the semiconductor material from said source.

5. A method of forming a P-N junction in a semiconductor device, comprising the steps of placing in an enclosed chamber a semiconductor wafer of germanium having an impurity of one conductivity, positioning within said enclosed chamber and in spaced relation to said wafer a source of semiconductor germanium material having an impurity of opposite conductivity, heating said wafer to a temperature of from 35° C. to 60° C. below the melting point thereof, evaporating said source, whereby the heat-laden evaporated particles therefrom contact said wafer, and melting the portions of said wafer at the points of impact between the wafer and said particles, whereby recrystallization results in a crystal of opposite conductivity and original lattice symmetry as said wafer.

References Cited by the Examiner

UNITED STATES PATENTS

| | | | |
|---|---|---|---|
| 2,759,861 | 8/1956 | Collins et al. | 148—1.5 |
| 2,780,569 | 2/1957 | Hewlett | 148—1.5 |
| 2,789,068 | 4/1957 | Maserjian | 148—180 |
| 2,802,759 | 8/1957 | Moles | 148—180 |
| 2,840,494 | 6/1958 | Parker | 148—33 X |
| 2,850,414 | 9/1958 | Enomoto | 148—1.5 X |
| 2,994,621 | 8/1961 | Hugle et al. | 117—201 |

DAVID L. RECK, *Primary Examiner.*

HYLAND BIZOT, BENJAMIN HENKIN, *Examiners.*

M. A. CIOMEK, R. O. DEAN, *Assistant Examiners.*